United States Patent
Yoon et al.

(10) Patent No.: US 12,516,033 B2
(45) Date of Patent: Jan. 6, 2026

(54) ORGANIC COMPOUND, AND ORGANIC LIGHT EMITTING DIODE AND ORGANIC LIGHT EMITTING DISPLAY DEVICE INCLUDING THE SAME

(71) Applicant: LG Display Co., Ltd, Seoul (KR)

(72) Inventors: Kyung-Jin Yoon, Paju-si (KR); Hyo-Jin Noh, Paju-si (KR); Jeong-Eun Baek, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 733 days.

(21) Appl. No.: 16/428,847

(22) Filed: May 31, 2019

(65) Prior Publication Data

US 2019/0372022 A1   Dec. 5, 2019

(30) Foreign Application Priority Data

Jun. 1, 2018   (KR) .................. 10-2018-0063613

(51) Int. Cl.
*C07D 209/82* (2006.01)
*C07D 307/91* (2006.01)
(Continued)

(52) U.S. Cl.
CPC ......... *C07D 307/91* (2013.01); *C07D 405/14* (2013.01); *C09K 11/06* (2013.01);
(Continued)

(58) Field of Classification Search
CPC ............. H01L 51/0073; H01L 27/3248; H01L 51/0072; H01L 51/5012; H01L 51/5016;
(Continued)

(56) References Cited

U.S. PATENT DOCUMENTS

| 9,711,735 B2 | 7/2017 | Yang et al. | |
| 2010/0084966 A1* | 4/2010 | Otsu ..................... | C09K 11/06 313/504 |

(Continued)

FOREIGN PATENT DOCUMENTS

| CN | 105524071 A | 4/2016 | |
| JP | 2008060379 A * | 3/2008 | ............. H01L 51/50 |

(Continued)

OTHER PUBLICATIONS

KR-20140132244-A—translation (Year: 2014).*

(Continued)

*Primary Examiner* — Jennifer A Boyd
*Assistant Examiner* — Rachel Simbana
(74) *Attorney, Agent, or Firm* — Seed Intellectual Property Law Group LLP

(57) ABSTRACT

The present disclosure provides an organic compound having the following formula and an organic light emitting diode (OLED) and an OLED device including the organic compound.

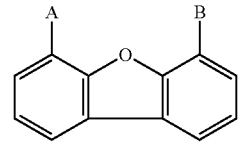

3 Claims, 5 Drawing Sheets

(51) Int. Cl.
    *C07D 405/10*     (2006.01)
    *C07D 405/14*     (2006.01)
    *C07D 409/10*     (2006.01)
    *C07D 409/14*     (2006.01)
    *C09K 11/06*     (2006.01)
    *H10K 50/11*     (2023.01)
    *H10K 50/12*     (2023.01)
    *H10K 50/13*     (2023.01)
    *H10K 50/15*     (2023.01)
    *H10K 50/16*     (2023.01)
    *H10K 50/17*     (2023.01)
    *H10K 59/123*     (2023.01)
    *H10K 85/60*     (2023.01)
    *H10K 101/10*     (2023.01)
    *H10K 101/30*     (2023.01)

(52) U.S. Cl.
    CPC ....... H10K 59/123 (2023.02); H10K 85/6572 (2023.02); H10K 85/6574 (2023.02); *C09K 2211/1018* (2013.01); *H10K 50/11* (2023.02); *H10K 50/13* (2023.02); *H10K 50/15* (2023.02); *H10K 50/16* (2023.02); *H10K 50/171* (2023.02); *H10K 2101/10* (2023.02); *H10K 2101/30* (2023.02)

(58) Field of Classification Search
    CPC ............... H01L 51/504; H01L 51/5056; H01L 51/5072; H01L 51/5088; H01L 51/5092; H01L 51/5096; H01L 2251/552; H01L 27/3244; H01L 51/0067; H01L 51/0071; H01L 51/0074; C07D 307/91; C07D 405/14; C07D 405/10; C07D 409/10; C07D 409/14; C09K 11/06; C09K 2211/1018; C09K 2211/1007; C09K 2211/1029; C09K 2211/1088; C09K 2211/1092; C09K 2211/1096; C07F 5/02; H10K 85/649; H10K 85/653; H10K 85/657–6576; H10K 85/6574; H10K 85/6572
    See application file for complete search history.

(56) References Cited

U.S. PATENT DOCUMENTS

| | | | | |
|---|---|---|---|---|
| 2011/0006670 A1* | 1/2011 | Katakura | ............ | C07D 403/10 548/402 |
| 2013/0234119 A1* | 9/2013 | Mizuki | ................ | H10K 85/654 257/40 |
| 2014/0217335 A1* | 8/2014 | Tanabe | ................ | H10K 85/626 548/440 |
| 2014/0316134 A1* | 10/2014 | Stoessel | ............. | H01L 51/0071 546/18 |
| 2015/0280158 A1* | 10/2015 | Ogiwara | ............. | H01L 51/5016 257/40 |
| 2015/0322337 A1* | 11/2015 | Hattori | ................ | C07F 9/65586 548/440 |
| 2016/0118601 A1* | 4/2016 | Huh | .................... | H10K 85/6574 257/40 |
| 2016/0181548 A1* | 6/2016 | Parham | ................ | C07D 251/24 548/440 |
| 2016/0268516 A1 | 9/2016 | Tanaka et al. | | |
| 2016/0365389 A1 | 12/2016 | Gao et al. | | |
| 2017/0098780 A1* | 4/2017 | Kim | .................... | H10K 85/361 |
| 2017/0256729 A1* | 9/2017 | Wang | .................... | H10K 85/40 |
| 2018/0090705 A1 | 3/2018 | Kim et al. | | |

FOREIGN PATENT DOCUMENTS

| | | | | |
|---|---|---|---|---|
| JP | 2013038299 A | | 2/2013 | |
| JP | 2013131518 A | * | 7/2013 | |
| KR | 20140132244 A | * | 11/2014 | |
| WO | WO 2011004639 A1 | | 1/2011 | |
| WO | WO-2012015017 A1 | * | 2/2012 | ............. H05B 33/14 |
| WO | WO 2015022987 A1 | | 2/2015 | |
| WO | WO 2015087795 A1 | | 6/2015 | |
| WO | WO-2016116520 A1 | * | 7/2016 | ........... C07C 255/58 |

OTHER PUBLICATIONS

WO-2016116520-A1—translation (Year: 2016).*
JP-2008060379-A—translation (Year: 2008).*
JP-2013131518-A—translation (Year: 2013).*
WO-2012015017-A1—translation (Year: 2012).*
Jankus et al., "Highly Efficient TADF OLEDs: How the Emitter-Host Interaction Controls Both the Excited State Species and Electrical Properties of the Devices to Achieve Near 100% Triplet Harvesting and High Efficiency," *Adv. Funct. Mater.* 24(39):6178-6186, 2014.
Ohkuma et al., "Thermally Activated Delayed Fluorescence from a Spiro-diazafluorene Derivative," *Chem. Lett.* 43:1017-1019, 2014.
Bigdeli et al., "Ab initio study of atropisomers of derivatives of 1,8-di-pyridine 9H-fluorene, dibenzo[b,d]furan, 9H-carbazole and dibenzo[b, d]thiophene," Journal of Molecular Structure: Theochem 860(1-3):64-79, 2008.

* cited by examiner

ORGANIC COMPOUND, AND ORGANIC LIGHT EMITTING DIODE AND ORGANIC LIGHT EMITTING DISPLAY DEVICE INCLUDING THE SAME

CROSS-REFERENCE TO RELATED APPLICATIONS

The present application claims the benefit of Korean Patent Application No. 10-2018-0063613 filed in the Republic of Korea on Jun. 1, 2018, which is hereby incorporated by reference in its entirety.

BACKGROUND

Technical Field

The present disclosure relates to an organic compound, and more particularly, to an organic compound having high energy level of triplet state and being used for an n-type host, and an organic light emitting diode and an organic light emitting display (OLED) device including the organic compound.

Description of the Related Art

Recently, requirement for flat panel display devices having small occupied area is increased. Among the flat panel display devices, a technology of an OLED device, which includes an organic light emitting diode and may be called to as an organic electroluminescent device, is rapidly developed.

The organic light emitting diode emits light by injecting electrons from a cathode as an electron injection electrode and holes from an anode as a hole injection electrode into an organic emitting layer, combining the electrons with the holes, generating an exciton, and transforming the exciton from an excited state to a ground state. A flexible transparent substrate, for example, a plastic substrate, can be used as a base substrate where elements are formed. In addition, the organic light emitting diode can be operated at a voltage (e.g., 10V or below) lower than a voltage required to operate other display devices and has low power consumption. Moreover, the light from the organic light emitting diode has excellent color purity.

The organic emitting layer may have a single-layered structure of an emitting material layer (EML). Alternatively, to improve the emission efficiency, the organic emitting layer may have a multi-layered structure. For example, the organic emitting layer may include a hole injection layer (HIL), a hole transporting layer (HTL), the EML, an electron transporting layer (ETL) and an electron injection layer (EIL).

The EML includes a dopant as an emitter. However, since the emission efficiency of the dopant is rapidly decreased by a concentration quenching problem, there is a limitation in the OLED device including the EML with only dopant. Accordingly, the EML further includes a host having an energy level of triplet state being greater than the dopant.

For example, an organic compound such as CBP may be used as the host in the EML. However, in the related art organic light emitting diode, there are limitations in the lifespan and the emitting efficiency.

Namely, there are limitations in the lifespan and the emitting efficiency of the organic light emitting diode and the OLED device.

BRIEF SUMMARY

The present disclosure is directed to an organic compound, an organic light emitting diode and an OLED device that substantially obviate one or more of the problems associated with the limitations and disadvantages of the related conventional art.

Additional features and advantages of the disclosure are set forth in the description which follows, and will be apparent from the description, or evident by practice of the disclosure. The objectives and other advantages of the disclosure are realized and attained by the features described herein as well as in the appended drawings.

To achieve these and other advantages in accordance with the purpose of the embodiments of the disclosure, as described herein, an aspect of the disclosure is an organic compound of Formula 1:

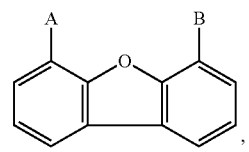

Formula 1 wherein each of A and B is independently selected from Formula 2:

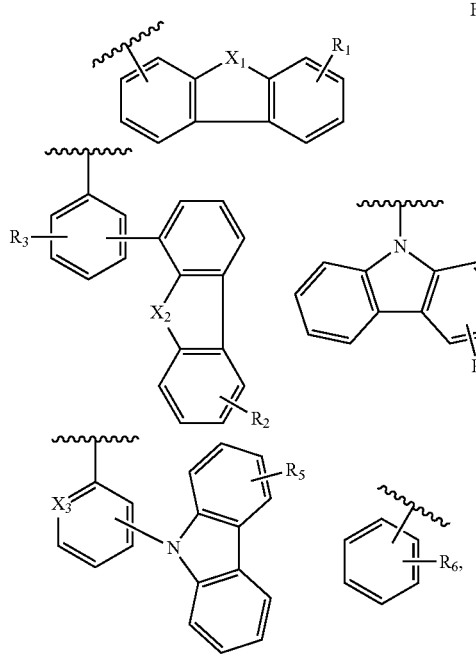

Formula 2 wherein each of X1 and X2 is independently oxygen or sulfur, and X3 is carbon or nitrogen, and wherein each of R1, R2, R3, R4, R5 and R6 is independently selected from the group consisting of hydrogen, a cyano group and a C1 to C10 alkyl group.

Another aspect of the disclosure is an organic light emitting diode including a first electrode; a second electrode facing the first electrode; and a first emitting material layer between the first and second electrodes and including an organic compound.

Another aspect of the disclosure is an organic light emitting display device including a substrate; an organic light emitting diode disposed on the substrate; a thin film transistor positioned between the substrate and the organic light emitting diode and connected to the organic light emitting diode.

It is to be understood that both the foregoing general description and the following detailed description are exemplary and explanatory and are intended to further explain the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

Reference will now be made in detail to some of the examples and preferred embodiments, which are illustrated in the accompanying drawings.

Figure 1:
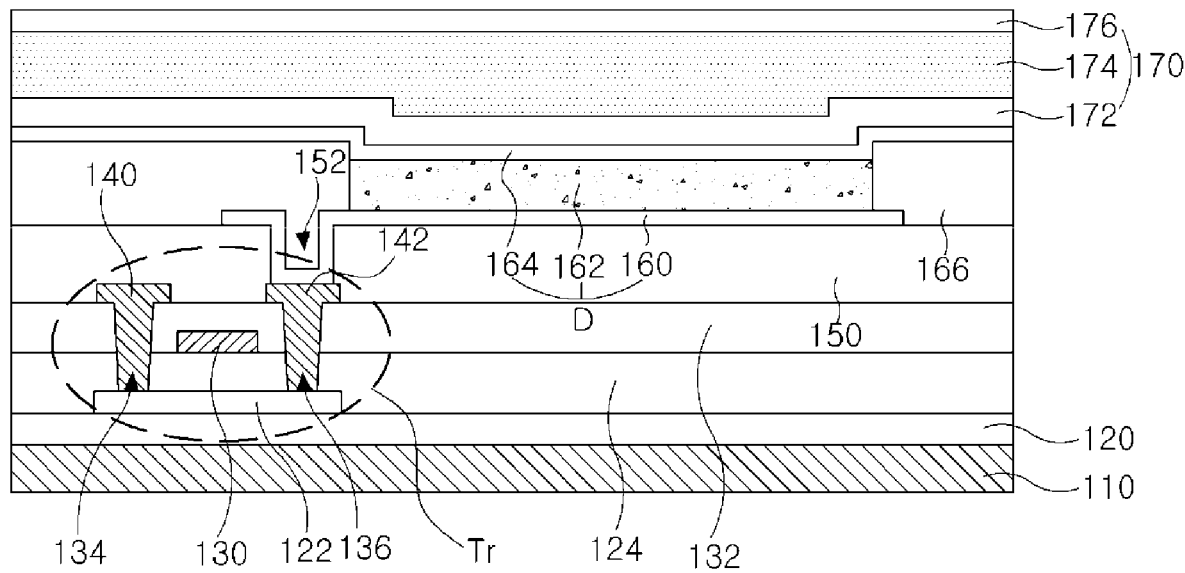
FIG. 1 is a schematic cross-sectional view of an OLED device of the present disclosure.

FIG. 1 is a schematic cross-sectional view of an OLED device of the present disclosure.

As shown in FIG. 1, the OLED device 100 includes a substrate 110, a TFT Tr and an organic light emitting diode D connected to the TFT Tr.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 1, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each: other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element.

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the OLED device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel region and exposes a center of the first electrode 160 in the pixel region.

An organic emitting layer 162 is formed on the first electrode 160. The organic emitting layer 162 may have a single-layered structure of an emitting material layer including an emitting material. To increase an emitting efficiency of the OLED device, the organic emitting layer 162 may have a multi-layered structure.

Figure 2:
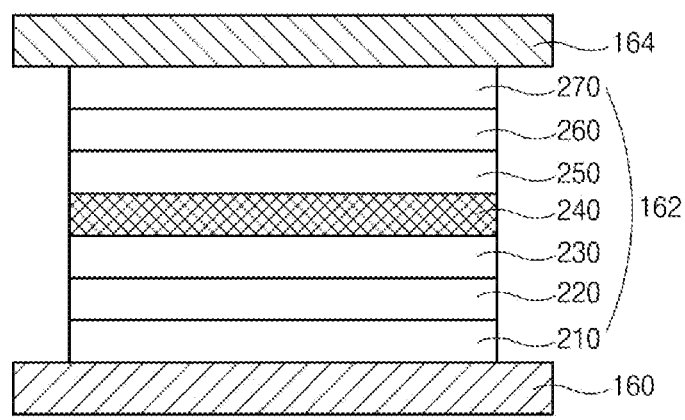
FIG. 2 is a schematic cross-sectional view of an organic light emitting diode of the present disclosure.

For example, as shown in FIG. 2, the organic emitting layer 162 may include the first electrode 160, a second electrode 164, the emitting material layer (EML) 240 between the first and second electrodes 160 and 164, a hole transporting layer (HTL) 220 between the first electrode 160 and the EML 240 and an electron transporting layer (ETL) 260 between the EML 240 and the second electrode 164.

In addition, the organic emitting layer 162 may further include a hole injection layer (HIL) 210 between the first electrode 160 and the HTL 220 and an electron injection layer (EIL) 270 between the second electrode 164 and the ETL 260.

Moreover, the organic emitting layer 162 may further include an electron blocking layer (EBL) 230 between the HTL 220 and the EML 240 and a hole blocking layer (HBL) 250 between the EML 240 and the ETL 260.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg) or Al—Mg alloy.

The first electrode 160, the organic emitting layer 162 and the second electrode 164 constitute the organic light emitting diode D.

An encapsulation film 170 is formed on the second electrode 164 to prevent penetration of moisture into the organic light emitting diode D. The encapsulation film 170 includes a first inorganic insulating layer 172, an organic insulating layer 174 and a second inorganic insulating layer 176 sequentially stacked, but it is not limited thereto.

A polarization plate (not shown) for reducing an ambient light reflection may be disposed over the top-emission type organic light emitting diode D. For example, the polarization plate may be a circular polarization plate.

In addition, a cover window (not shown) may be attached to the encapsulation film 170 or the polarization plate. In this instance, the substrate 110 and the cover window have a flexible property such that a flexible OLED device may be provided.

The organic emitting layer 162 includes an organic compound of Formula 1.

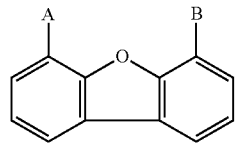

Formula 1

In Formula 1, each of A and B is independently selected from substituted or non-substituted dibenzofuranyl, substituted or non-substituted dibenzofuranyl phenyl, substituted or non-substituted carbazolyl, substituted or non-substituted carbazolyl phenyl, substituted or non-substituted carbazolyl pyridyl, substituted or non-substituted dibenzothiophenyl, substituted or non-substituted dibenzothiophenyl phenyl, substituted or non-substituted phenyl and substituted or non-substituted pyridyl. The substituent may be a cyano group or a C1 to C10 alkyl group.

For example, at least one of A and B may be one of substituted or non-substituted dibenzofuranyl and substituted or non-substituted dibenzofuranyl phenyl. Namely, in the organic compound of the present disclosure, dibenzofuranyl substituent may be bonded (connected or combined) to at least one of 4th position or 6th position of a dibenzonfuran core directly or via a phenylene linker.

Each of A and B may be independently selected from Formula 2.

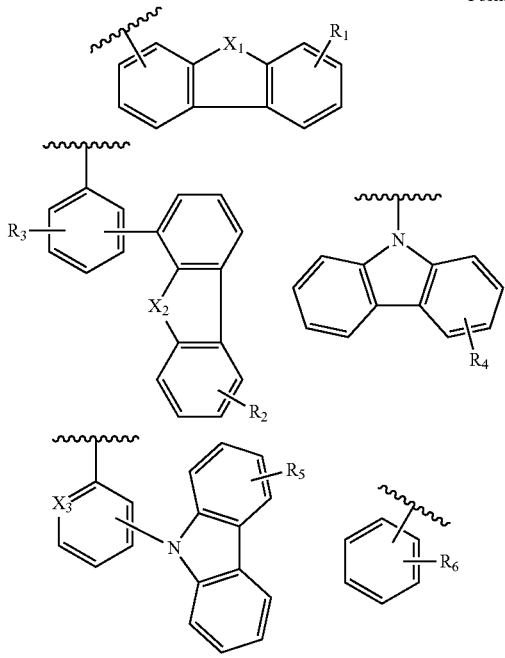

Formula 2

In Formula 2, each of X1 and X2 may be one of oxygen and sulfur, and X3 may be one of carbon and nitrogen. Each of R1, R2, R3, R4, R5 and R6 may be independently selected from the group consisting of hydrogen, a cyano group and a C1 to C10 alkyl group.

For example, each of A and B may be independently selected from Formula 3.

Formula 3

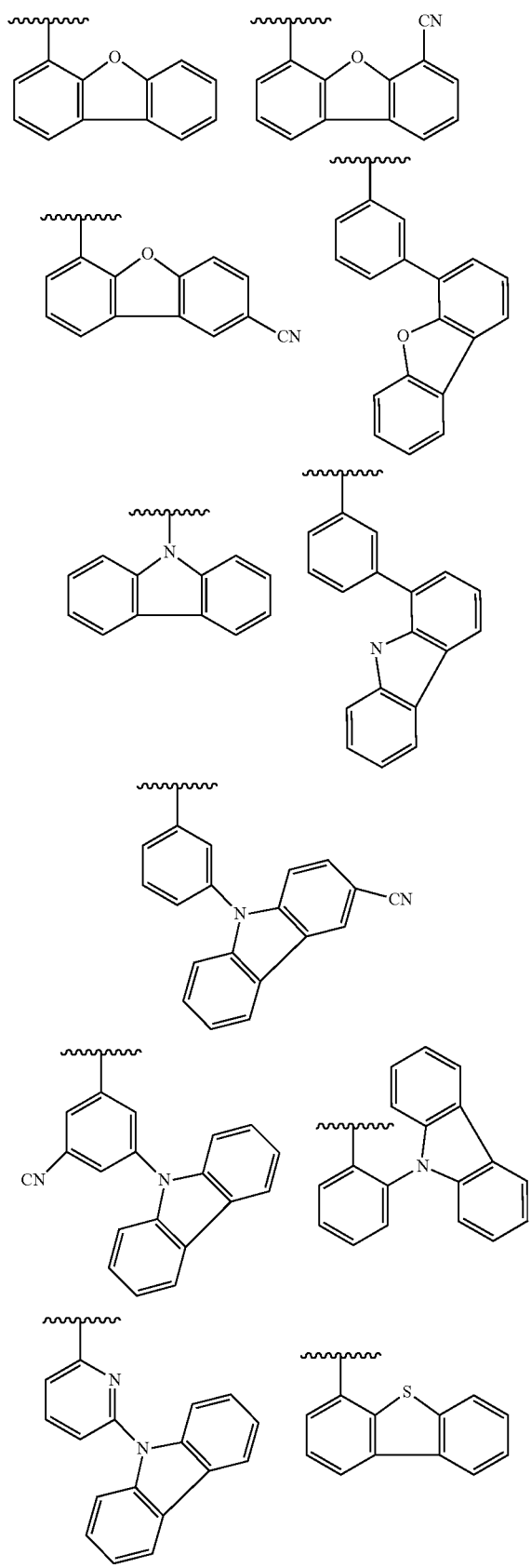

The organic compound of the present disclosure includes the dibenzofuran core such that the organic compound may be used as an n-type host.

In addition, since at least one of a dibenzofuranyl moiety, a carbazolyl moiety, a dibenzothiophenyl moiety, phenyl moiety and a pyridyl moiety is bonded to 4th position and/or 6th position of the dibenzonfuran core directly or via a linker (i.e., a phenylene linker or a pyridyl linker), the organic compound of the present disclosure has high energy level of triplet state.

Moreover, when at least one of a dibenzofuranyl moiety, a carbazolyl moiety and a dibenzothiophenyl moiety is bonded to the dibenzofuran core via the linker, the dibenzofuranyl moiety, the carbazolyl moiety or the dibenzothiophenyl moiety and the dibenzofuran core are bonded at a meta-position such that the energy level of triplet state of the organic compound is further increased.

Accordingly, when the organic compound of the present disclosure is included in the EML as a host, the emitting efficiency and the lifespan of the organic light emitting diode and the OLED device are improved.

Generally, an n-type organic compound has a relatively low energy level of triplet state. Even through a carbazole moiety is included in the organic compound to increase the energy level of triplet state, there is a limitation in increase of the energy level of triplet state.

However, since at least one of a dibenzofuranyl moiety, a carbazolyl moiety, a dibenzothiophenyl moiety, a phenyl moiety and a pyridyl moiety is bonded to 4th position and/or 6th position of the dibenzonfuran core, the organic compound of the present disclosure has high energy level of triplet state as well as the n-type property.

The organic compound of the present disclosure is included in the organic emitting layer 162, particularly, in the EML 240 or the HBL 250 of the organic emitting layer 162. When the organic compound is included in the EML 240 as the host, the EML may further include a dopant. The dopant may have a weight % of about 1 to 40 with respect to the host. The dopant may be at least one of a delayed fluorescent dopant, a phosphorescent dopant and a fluorescent dopant.

When the EML 240 includes the delayed fluorescent dopant (delayed fluorescent compound) with the organic compound of the present disclosure as the host, a difference between an energy level of the highest occupied molecular orbital (HOMO) of the host "$HOMO_{Host}$" and an energy level of the HOMO of the delayed fluorescent dopant "$HOMO_{Dopant}$" or a difference between an energy level of the lowest occupied molecular orbital (LUMO) of the host "LUMO$_{Host}$" and an energy level of the LUMO of the delayed fluorescent dopant "LUMO$_{Dopant}$" is less than about 0.5 eV. In this instance, the charge transfer efficiency from the host to the dopant may be improved.

The energy level of triplet state of the delayed fluorescent dopant is smaller than the energy level of triplet state of the host, and a difference between the energy level of singlet state of the delayed fluorescent dopant and the energy level of triplet state of the delayed fluorescent dopant is less than 0.3 eV. ($\Delta E_{ST} \leq 0.3$ eV.) As the difference "$\Delta E_{ST}$" is smaller, the emitting efficiency is higher. In addition, even if the difference "$\Delta E_{ST}$" between the energy level of singlet state of the delayed fluorescent dopant and the energy level of triplet state of the delayed fluorescent dopant is about 0.3 eV, which is relatively large, the excitons in the singlet state and the excitons in the triplet state can be transited into the intermediate state.

The EML 240 may include the organic compound of the present disclosure as the host with the delayed fluorescent dopant as a first dopant and the fluorescent dopant as a second dopant. The summation of the first dopant and the second dopant may be about 1 to 40 wt % with respect to the host.

The energy level of singlet state of the first dopant may be larger than that of the second dopant. The energy level of triplet state of the first dopant may be smaller than that of the host and larger than that of the second dopant.

In the organic light emitting diode D, since the EML 240 includes the host, the first dopant and the second dopant, the emitting efficiency and the color purity are improved. Namely, since the energy is transferred from the host into the first dopant and both the energy level of singlet state and the energy level of triplet state of the first dopant are transferred into the second dopant, the emission is generated from the second dopant such that the quantum efficiency of the organic light emitting diode D is increased and the full width at half maximum (FWHM) of the light from the organic light emitting diode D is narrowed.

The delayed fluorescent dopant as the first dopant has high quantum efficiency. However, since the light emitted from the delayed fluorescent dopant has wide FWHM, the light from the delayed fluorescent dopant has poor color purity. On the other hand, the fluorescent dopant as the second dopant has narrow FWHM and high color purity. However, since the energy level of triplet state of the fluorescent dopant is not engaged in the emission, the fluorescent dopant has low quantum efficiency.

Since the EML 240 of the organic light emitting diode D in the present disclosure includes the host, the first dopant and the second dopant, the organic light emitting diode D has advantages in both the emitting efficiency and the color purity.

In addition, since the organic compound of the present disclosure, which has high energy level of triplet state and the n-type property, is used as the host, the emitting efficiency is further improved.

For example, the organic compound of the present disclosure in Formula 1 may be one of the following compounds in Formula 4.

Formula 4

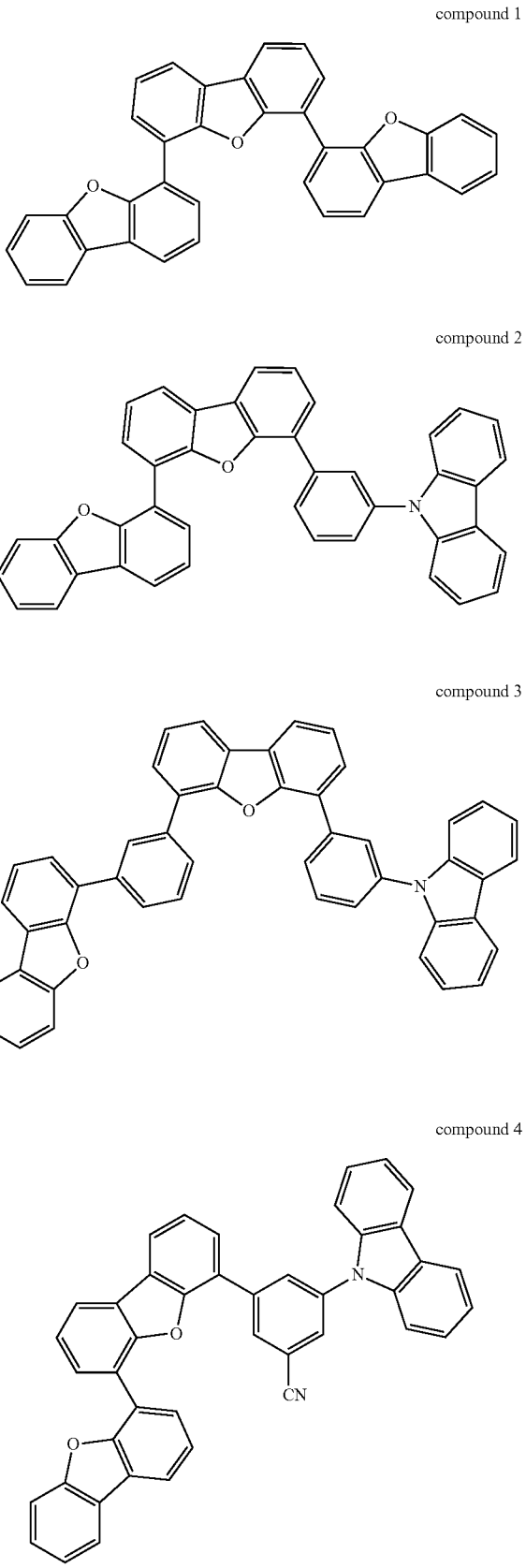

compound 1 compound 2 compound 3 compound 4

-continued
compound 5
compound 6
compound 7
compound 8
compound 9
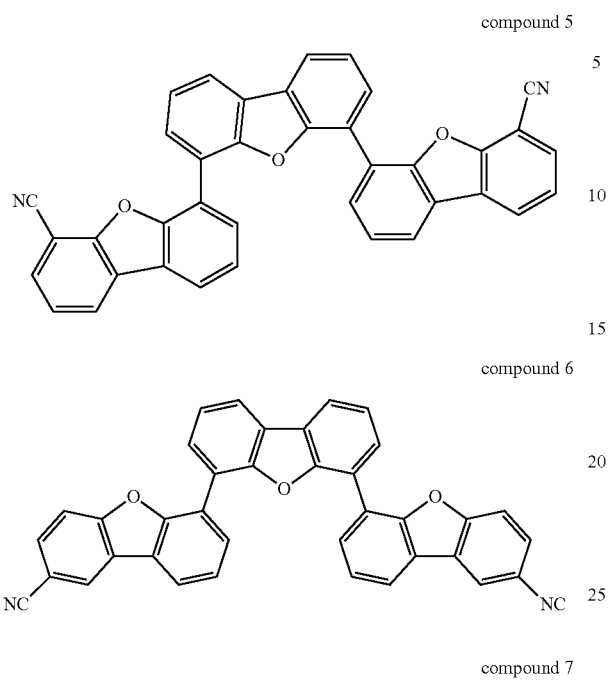
compound 10
compound 11
compound 12
compound 13
compound 14
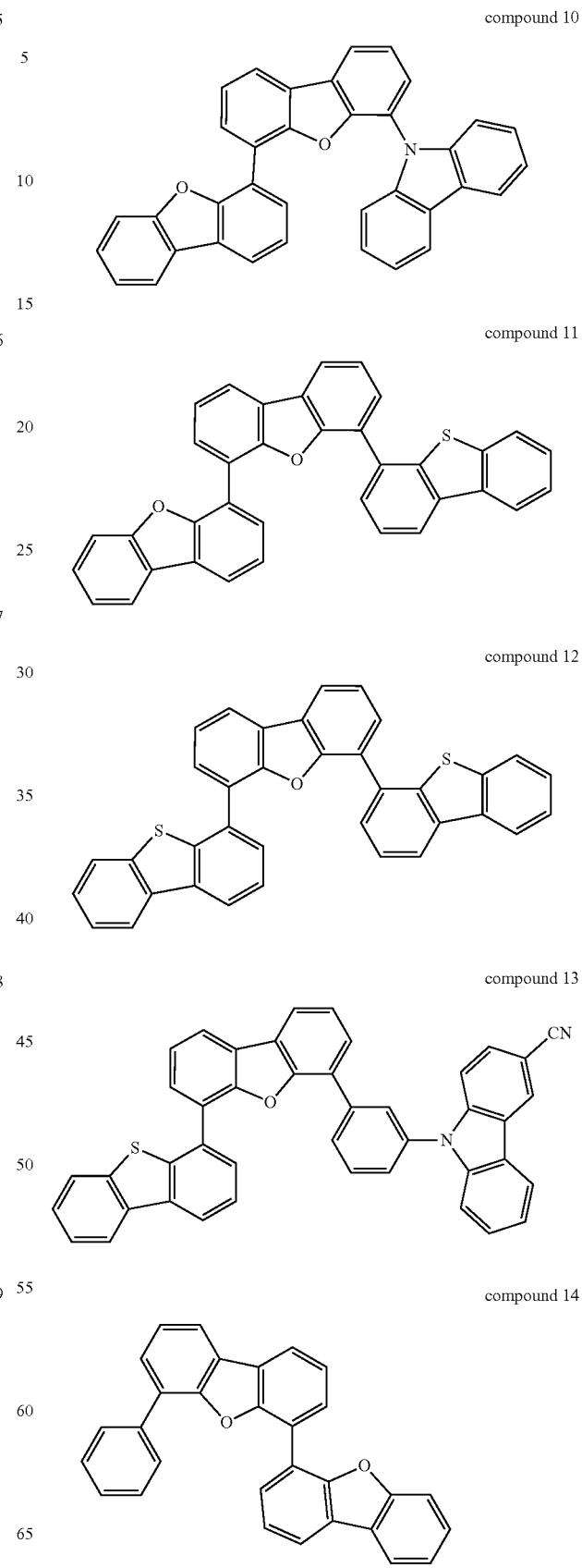

compound 15
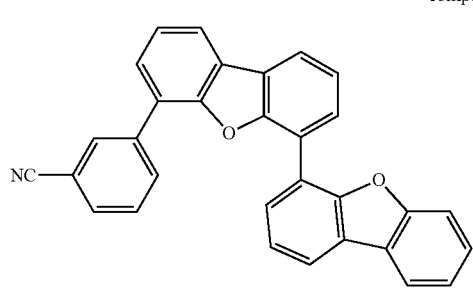
compound 16
compound 17
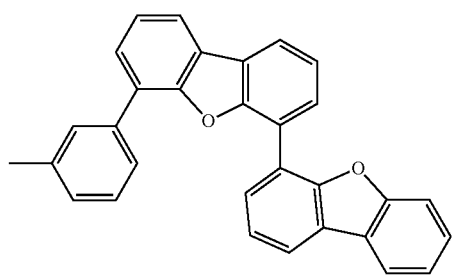
compound 18
compound 19
compound 20
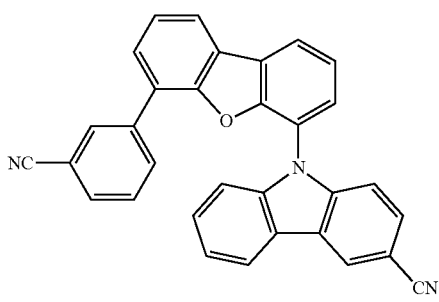
compound 21
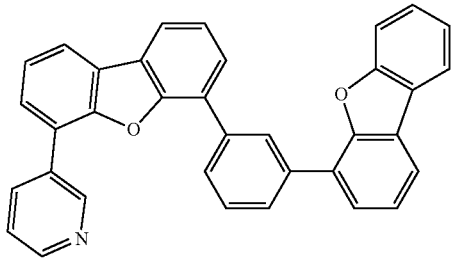
compound 22
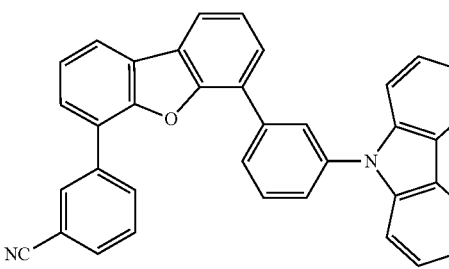
compound 23
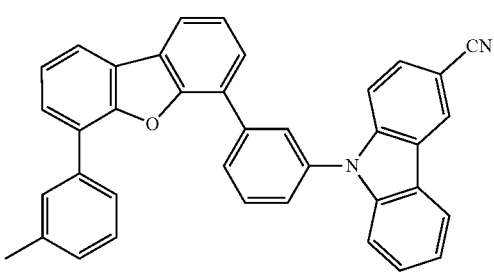
compound 24
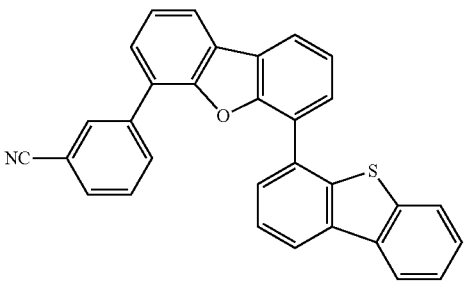

-continued compound 25

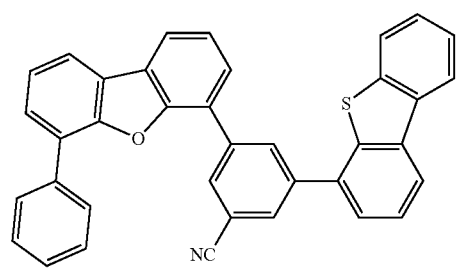

compound 26

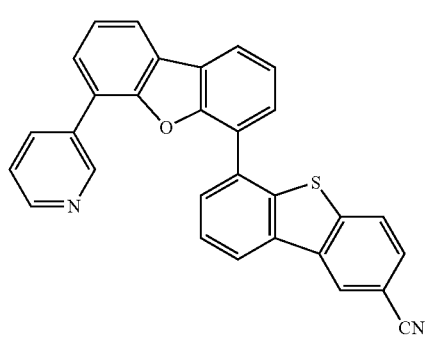

Synthesis of Organic Compounds

Synthesis of Compound 1

Reaction Formula 1

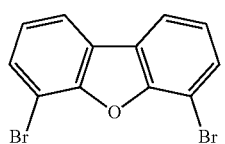

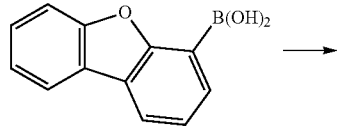

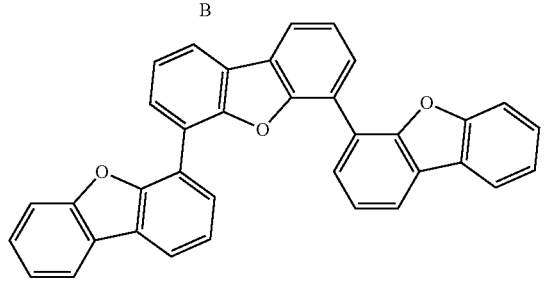

compound 1

Under nitrogen condition, after the compound A was dissolved in tetrahydrofuran/toluene (5:1) solvent, the compound B (2.4 equivalent) was added. After potassium carbonate (8.8 equivalent) was dissolved in DI water, Pd(0)(0.1 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 1 was obtained.

Figure 3:
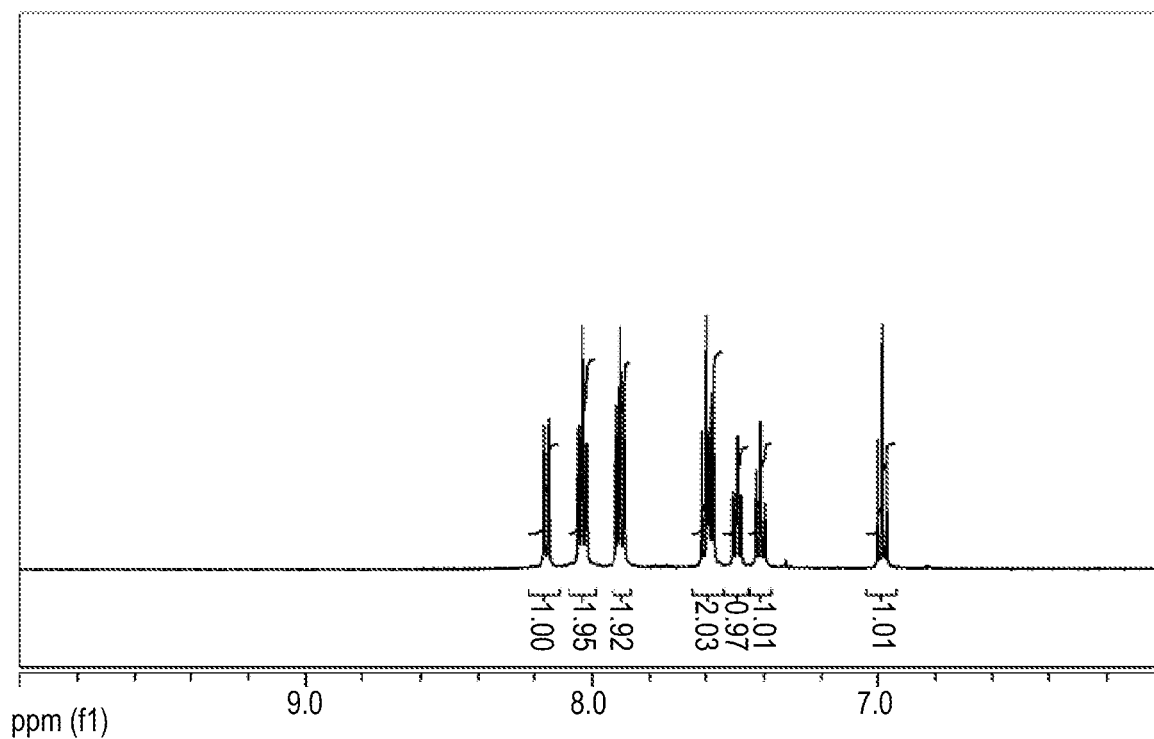
FIG. 3 is an NMR graph of compound 1 of the present disclosure.

The NMR graph of the compound 1 is shown in FIG. 3.

Synthesis of Compound 2

Reaction Formula 2-1

Compound C

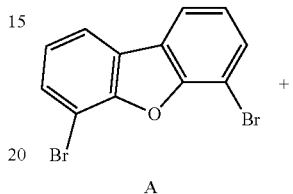

A

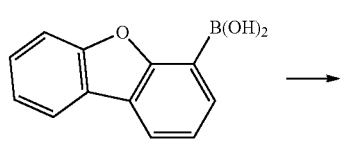

B

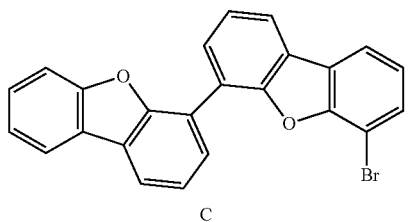

C

Under nitrogen condition, after the compound A was dissolved in tetrahydrofuran/toluene (5:1) solvent, the compound B (1.2 equivalent) was added. After potassium carbonate (4.4 equivalent) was dissolved in DI water, Pd (0)(0.05 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound C was obtained.

Reaction Formula 2-2

Compound F

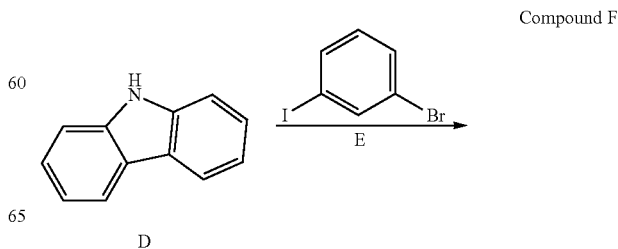

D

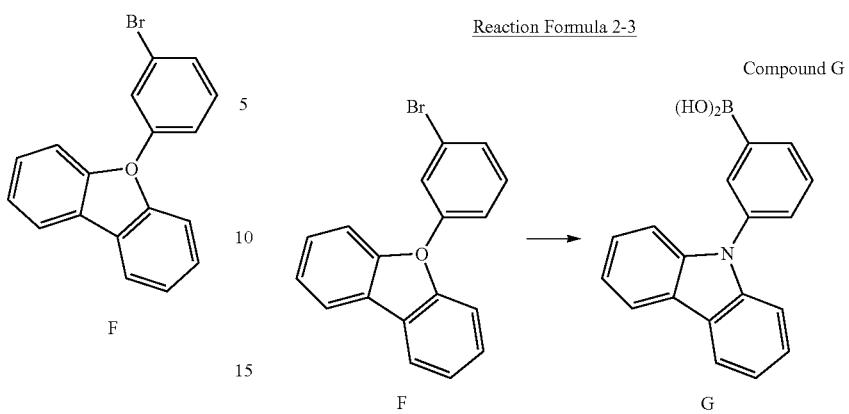

Under nitrogen condition, after the compound E was dissolved in toluene solvent, the compound D (1.2 equivalent) was added. After sodium t-butoxide (4.4 equivalent) was added, Pd$_2$(dba)$_3$ (0.05 equivalent) and tri-tert-butyl phosphine (0.05 equivalent) were added. The mixture was refluxed under the temperature of 80° C. and stirred for 24 hrs. After completion of the reaction, the resultant was extracted using an organic solvent, and the organic solvent was removed. The mixture was columned and reprecipitated such that the compound F was obtained.

Under nitrogen condition, after the compound F was dissolved in tetrahydrofuran solvent, n-butyllithium (1.2 equivalent) was slowly added under the temperature of −78° C. After the mixture was stirred under the temperature of −78° C. for 1 hr, the mixture was further stirred under the room temperature for 2 hrs. After the mixture was cooled into the temperature of −78° C., trimethyl borate was added, and the mixture was stirred under the room temperature for 2 hrs. The dilute HCl (5.0%) was slowly dropped into the mixture to keep pH of 5 to 6, and the mixture was stirred for 1 hr and extracted by dichloromethane. The organic layer was extracted by brine and DI water, and the moisture was removed by MgSO$_4$. The organic solvent was removed such that the compound G was obtained.

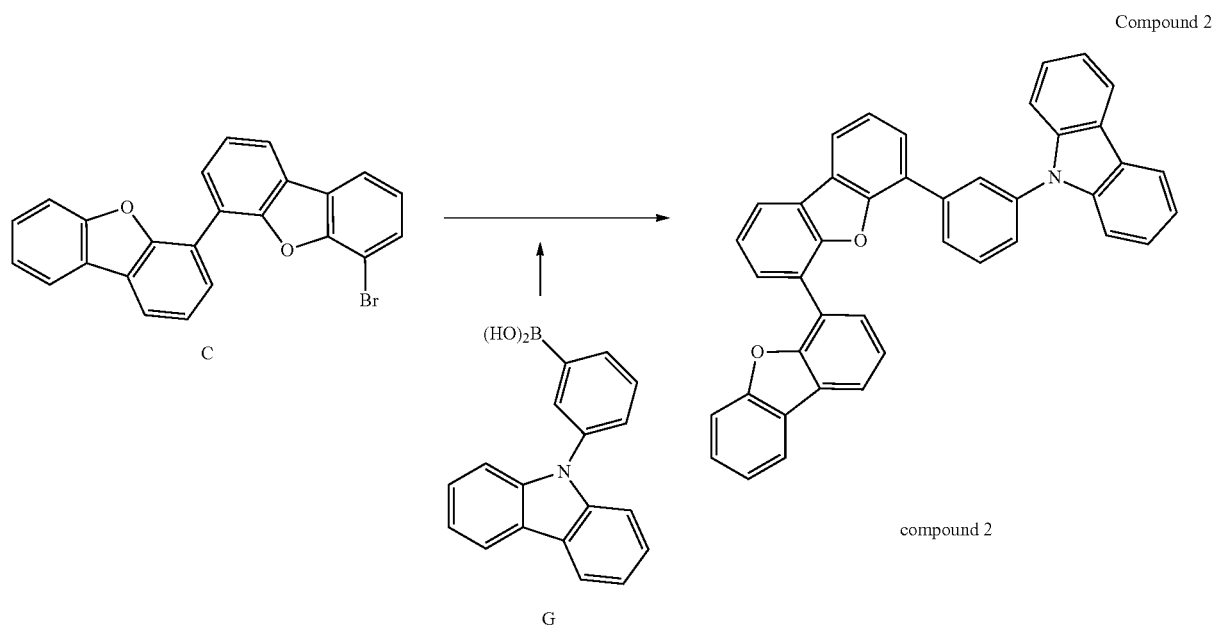

Under nitrogen condition, after the compound C was dissolved in tetrahydrofuran/toluene (5:1) solvent, the compound G (1.2 equivalent) was added. After potassium carbonate (4.4 equivalent) was dissolved in DI water, Pd (0)(0.05 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 2 was obtained.

Figure 4:
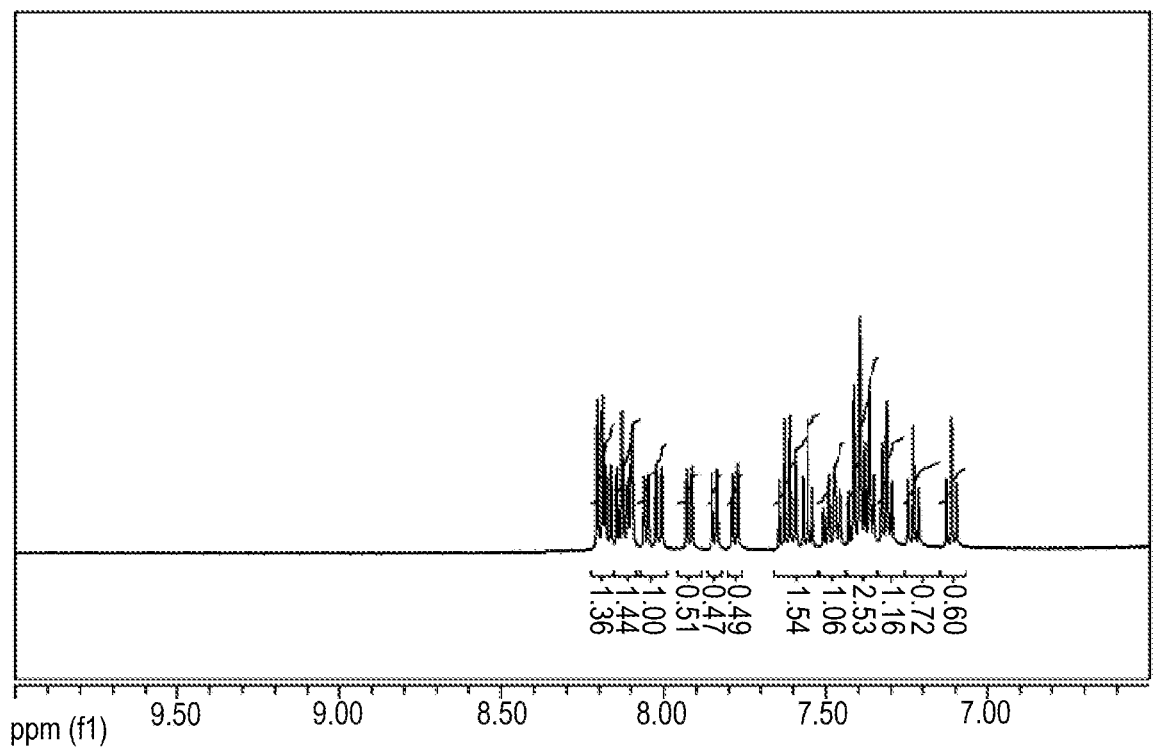
FIG. 4 is an NMR graph of compound 2 of the present disclosure.

The NMR graph of the compound 2 is shown in FIG. 4.

Synthesis of Compound 3

Reaction Formula 3-1

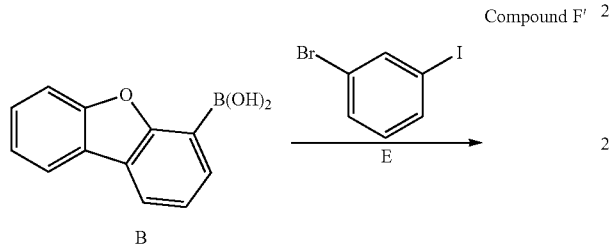

Under nitrogen condition, after the compound E was dissolved in tetrahydrofuran/toluene (5:1) solvent, the compound B (1.2 equivalent) was added. After potassium carbonate (4.4 equivalent) was dissolved in DI water, Pd (0)(0.04 equivalent) was added. The mixture was refluxed under the temperature of 60° C. and stirred for 24 hrs. After completion of the reaction, the resultant was extracted using an organic solvent, and the organic solvent was removed. The mixture was columned and reprecipitated such that the compound F' was obtained.

Reaction Formula 3-2

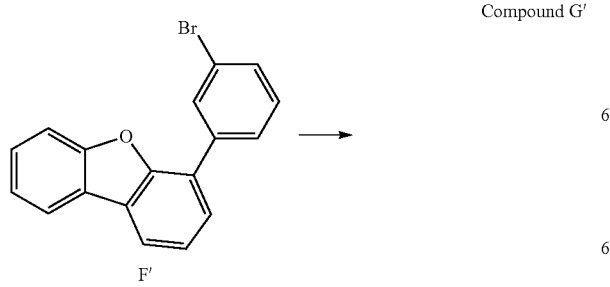

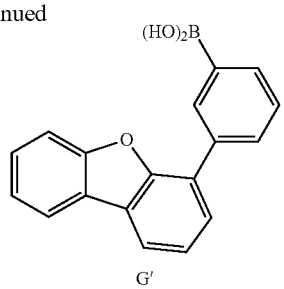

Under nitrogen condition, after the compound F' was dissolved in tetrahydrofuran solvent, n-butyllithium (1.2 equivalent) was slowly added under the temperature of −78° C. After the mixture was stirred under the temperature of −78° C. for 1 hr, the mixture was further stirred under the room temperature for 2 hrs. After the mixture was cooled into the temperature of −78° C. timethyl borate was added, and the mixture was stirred under the room temperature for 2 hrs. The dilute HCl (5.0%) was slowly dropped into the mixture to keep pH of 5 to 6, and the mixture was stirred for 1 hr and extracted by dichloromethane. The organic layer was extracted by brine and DI water, and the moisture was removed by MgSO$_4$. The organic solvent was removed such that the compound G' was obtained.

Reaction Formula 3-3

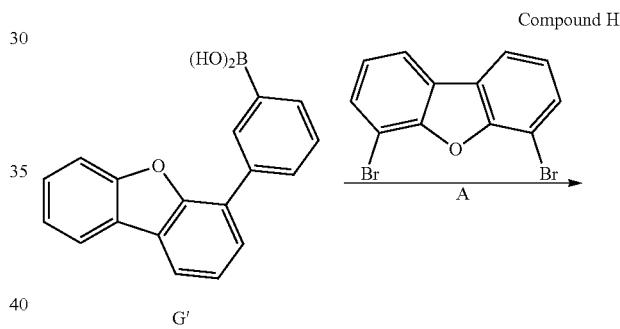

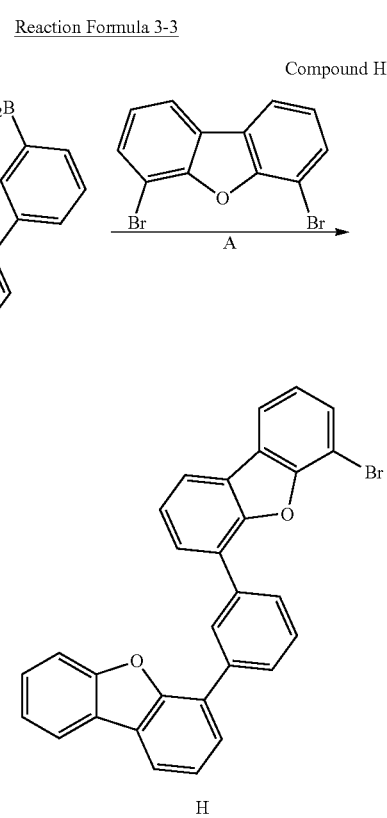

Under nitrogen condition, after the compound A was dissolved in tetrahydrofuran/toluene (5:1) solvent, the compound G' (1.2 equivalent) was added. After potassium carbonate (4.4 equivalent) was dissolved in DI water, Pd (0)(0.05 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound H was obtained.

Reaction Formula 3-4

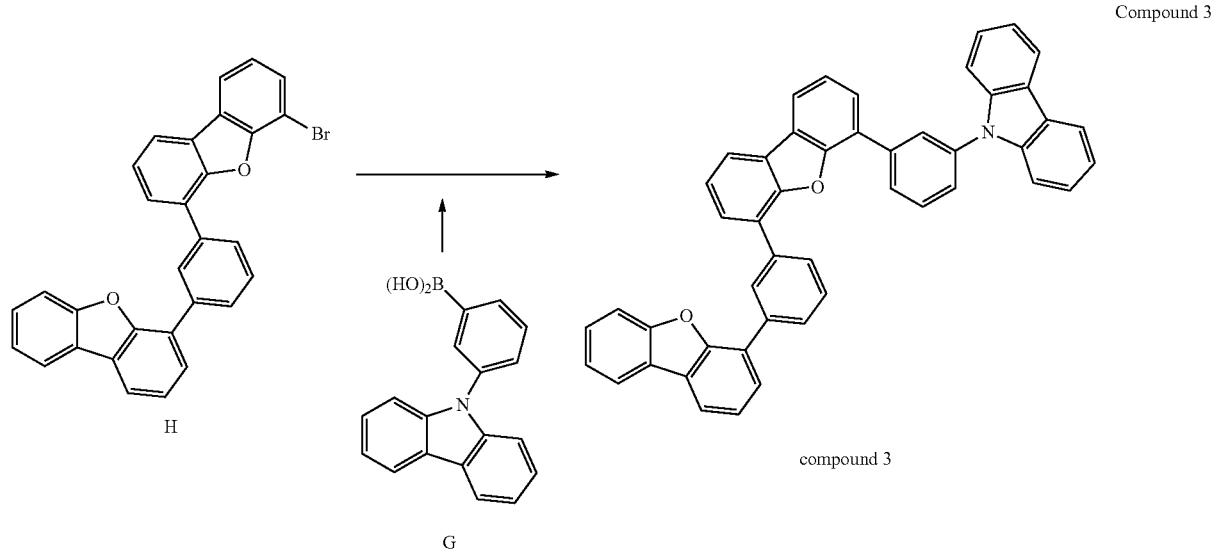

Under nitrogen condition, after the compound H was dissolved in tetrahydrofuran/toluene (5:1) solvent, the compound G (1.2 equivalent) was added. After potassium carbonate (4.4 equivalent) was dissolved in DI water, Pd(0)(0.05 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 3 was obtained.

Figure 5:
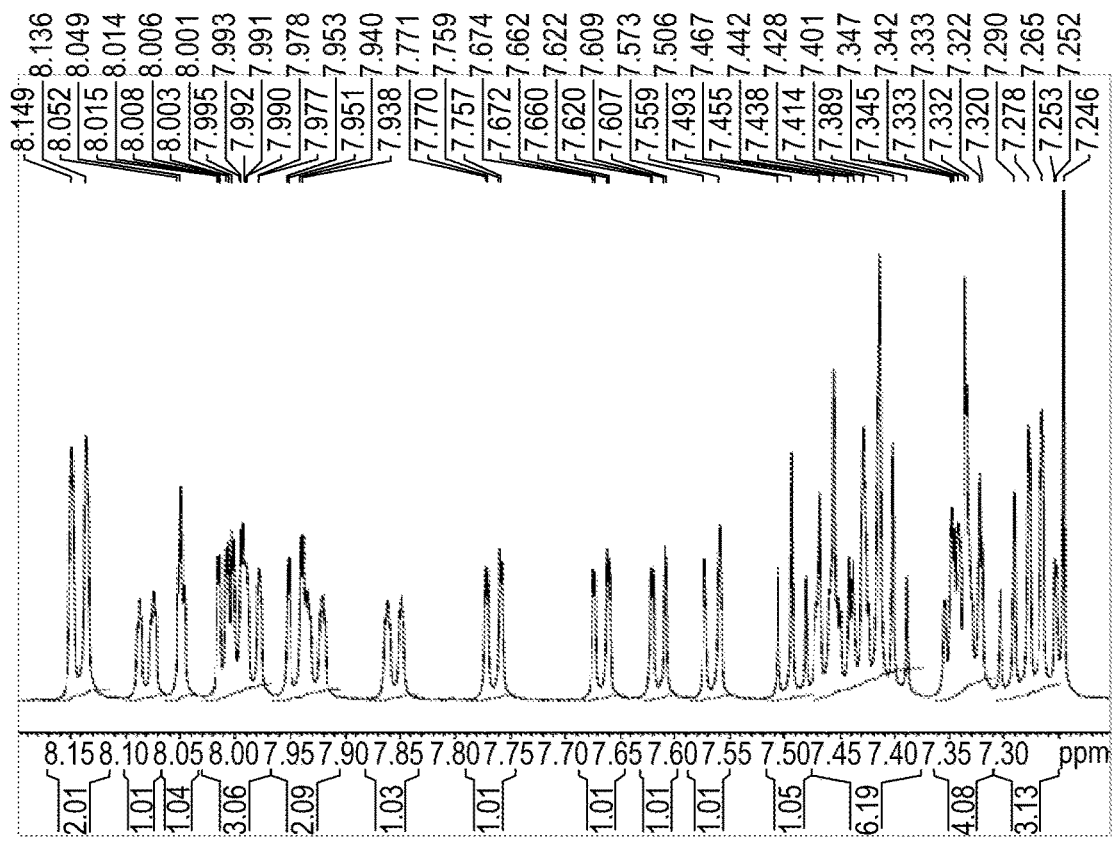
FIG. 5 is an NMR graph of compound 3 of the present disclosure.

The NMR graph of the compound 3 is shown in FIG. 5.

Synthesis of Compound 4

Reaction Formula 4-1

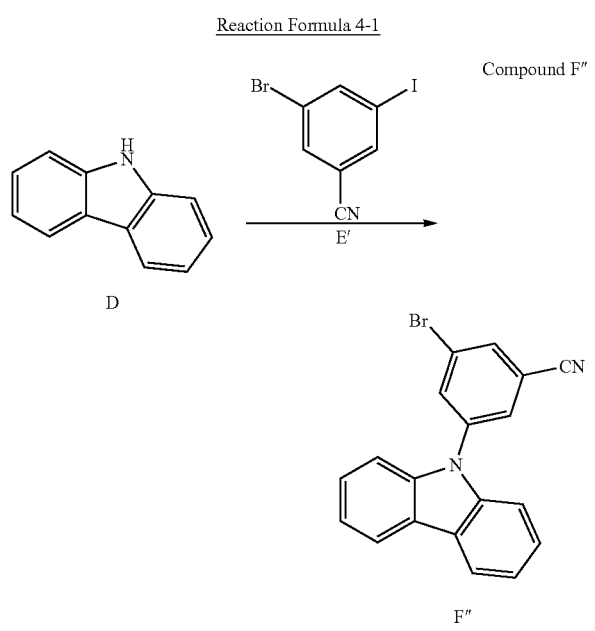

Reaction Formula 4-2

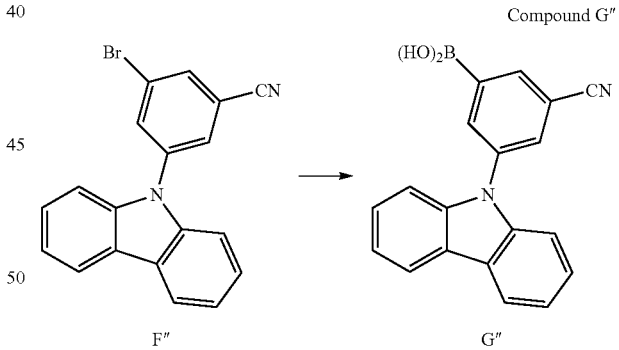

Under nitrogen condition, after the compound E' was dissolved in toluene solvent, the compound D (1.2 equivalent) was added. After sodium t-butoxide (4.4 equivalent) was added, $Pd_2(dba)_3$ (0.05 equivalent) and tri-tert-butyl phosphine (0.05 equivalent) were added. The mixture was refluxed under the temperature of 80° C. and stirred for 24 hrs. After completion of the reaction, the resultant was extracted using an organic solvent, and the organic solvent was removed. The mixture was columned and reprecipitated such that the compound F'' was obtained.

Under nitrogen condition, after the compound F'' was dissolved in tetrahydrofuran solvent, n-butyllithium (1.2 equivalent) was slowly added under the temperature of −78° C. After the mixture was stirred under the temperature of −78° C. for 1 hr, the mixture was further stirred under the room temperature for 2 hrs. After the mixture was cooled into the temperature of −78° C., trimethyl borate was added, and the mixture was stirred under the room temperature for 2 hrs. The dilute HCl (5.0%) was slowly dropped into the mixture to keep pH of 5 to 6, and the mixture was stirred for 1 hr and extracted by dichloromethane. The organic layer was extracted by brine and DI water, and the moisture was removed by $MgSO_4$. The organic solvent was removed such that the compound G'' was obtained.

Reaction Formula 4-3

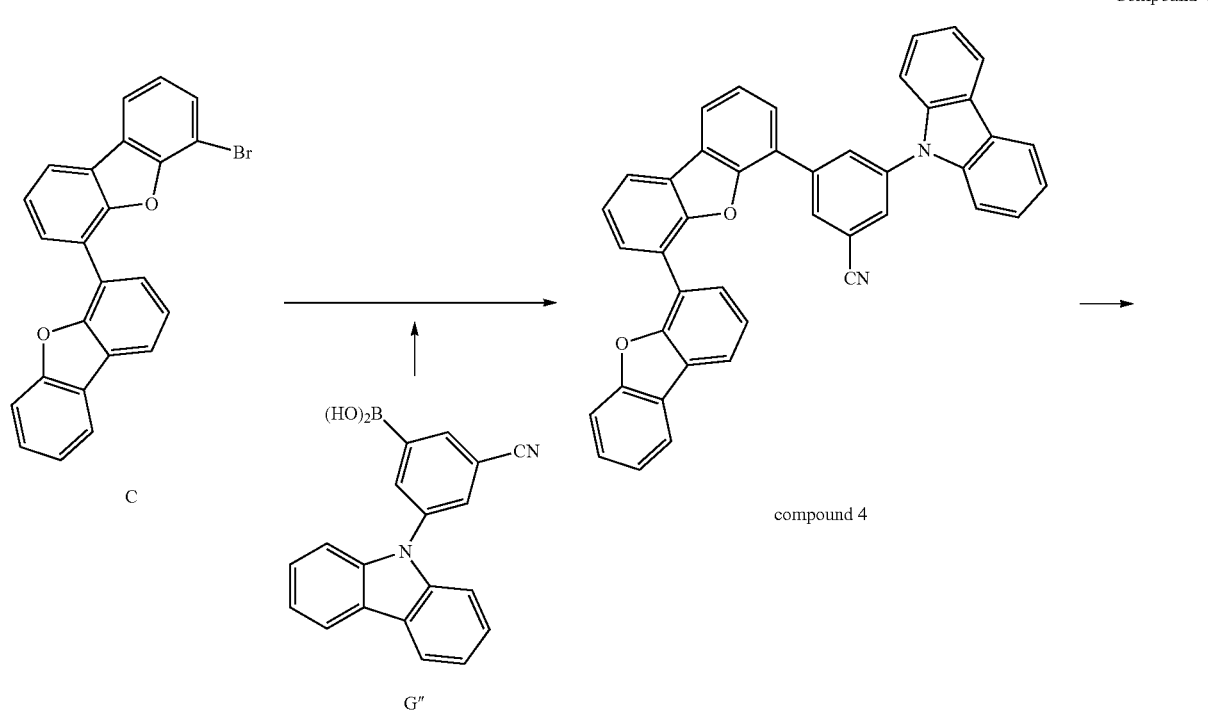

compound 4

Under nitrogen condition, after the compound C was dissolved in tetrahydrofuran/toluene (5:1) solvent, the compound G" (1.2 equivalent) was added. After potassium carbonate (4.4 equivalent) was dissolved in DI water, Pd (0)(0.05 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 4 was obtained.

Figure 6:
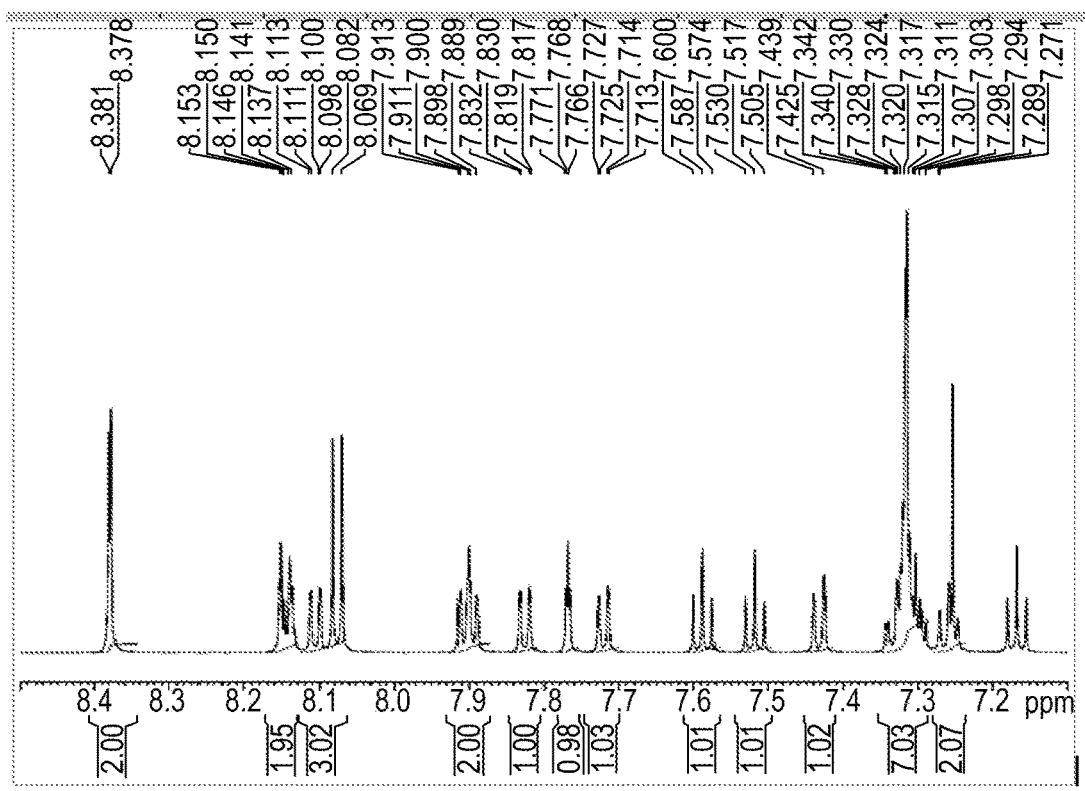
FIG. 6 is an NMR graph of compound 4 of the present disclosure.

The NMR graph of the compound 4 is shown in FIG. 6.

Synthesis of Compound 5

Reaction Formula 5

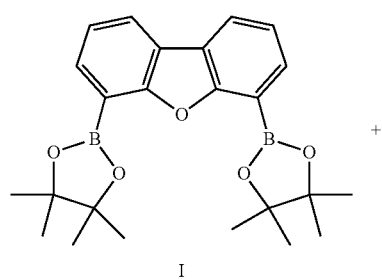

I

+

-continued

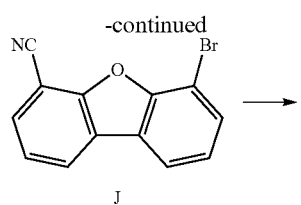

J

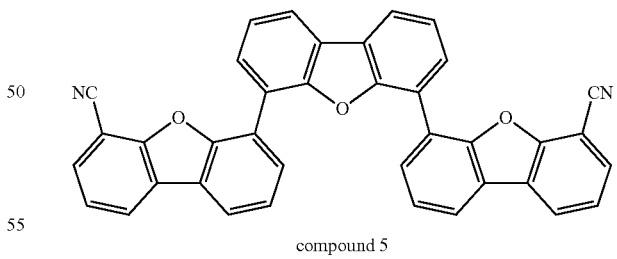

compound 5

Under nitrogen condition, after the compound I was dissolved in tetrahydrofuran/toluene (5:1) solvent, the compound J (2.4 equivalent) was added. After potassium carbonate (8.8 equivalent) was dissolved in DI water, Pd (0)(0.1 equivalent) was added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 5 was obtained.

Synthesis of Compound 10

Reaction Formula 6

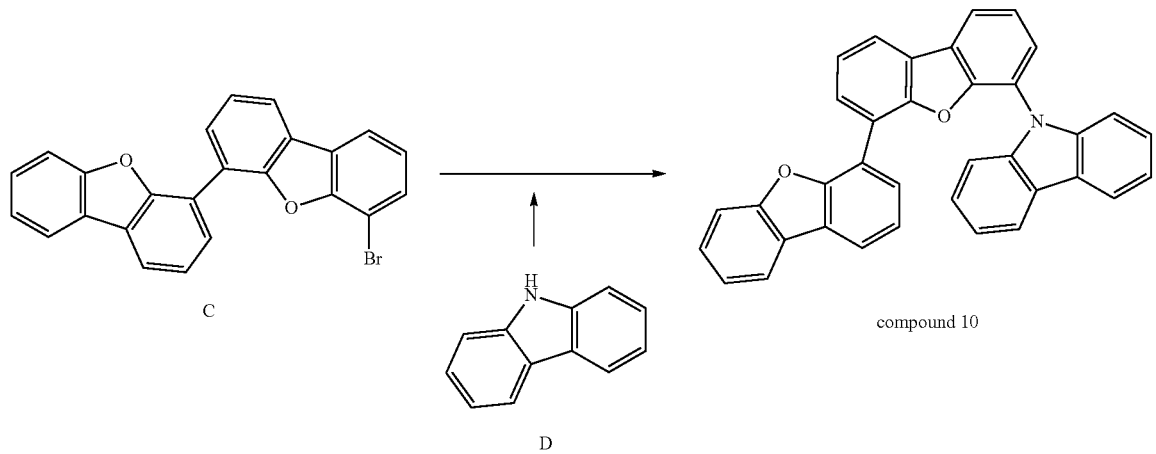

compound 10

Under nitrogen condition, after the compound C was dissolved in toluene solvent, the compound D (1.2 equivalent) was added. After sodium t-butoxide (4.4 equivalent) was added, Pd$_2$(dba)$_3$ (0.05 equivalent) and tri-tert-butyl phosphine (0.05 equivalent) were added. The mixture was refluxed under the temperature of 80° C. and stirred for 24 hrs. After completion of the reaction, the resultant was extracted using an organic solvent, and the organic solvent was removed. The mixture was columned and reprecipitated such that the compound 10 was obtained.

The properties, i.e., an energy-level of HOMO, an energy level of LUMO and an energy level of triplet state level ($E_T$), of the compounds 1 to 10 in Formula 4 and the compounds in Formulas 5 to 7 are measured and listed in Table 1. (unit: [eV])

-continued

Formula 6

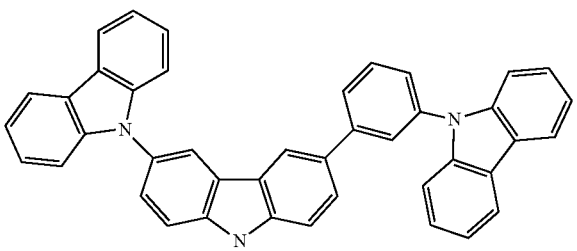

Formula 7

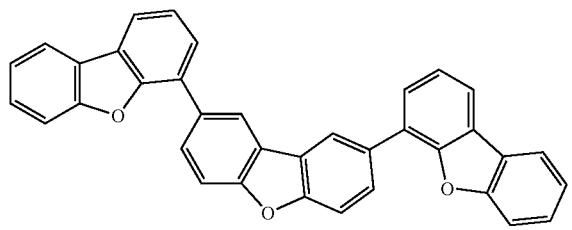

Formula 5

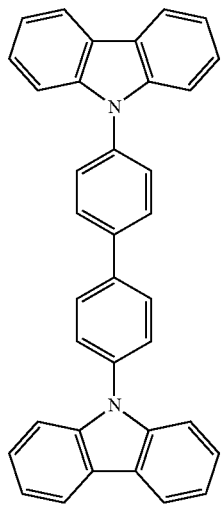

TABLE 1

|  | HOMO | LUMO | $E_T$ |
|---|---|---|---|
| Ref1 | −6.0 | −2.9 | 2.58 |
| Ref2 | −5.9 | −2.4 | 2.70 |
| Ref3 | −6.0 | −2.5 | 2.79 |
| Compound1 | −5.9 | −2.3 | 2.96 |
| Compound2 | −6.0 | −2.4 | 3.05 |
| Compound3 | −6.0 | −2.4 | 2.99 |
| Compound4 | −6.1 | −2.8 | 2.92 |
| Compound5 | −6.2 | −2.7 | 2.88 |
| Compound6 | −6.2 | −2.6 | 2.85 |
| Compound7 | −6.0 | −2.3 | 2.97 |
| Compound8 | −6.1 | −2.5 | 2.91 |
| Compound9 | −6.2 | −2.8 | 2.84 |
| Compound10 | −6.1 | −2.5 | 2.81 |

As shown in Table 1, in comparison to the CBP compound of Formula 5 (Ref1), the organic compound has higher energy level of triplet state. Accordingly, the organic light emitting diode including the organic compound of the present disclosure in the EML as the host provides high energy efficiency. As described below, since the emitting zone is shifted by the n-type organic compound of the present disclosure, the organic light emitting diode has advantages in the emitting efficiency and the lifespan in comparison to the related art p-type host.

Moreover, in comparison to the compounds in Formula 6 and Formula 7 (Ref2 and Ref3), in which carbazolyl moiety or dibenzofuranyl moiety is bonded to 2th position or 8th position of a dibenzofuran core, since the substituent, e.g., dibenzofuranyl moiety or carbazolyl moiety, is bonded to 4th position and/or 6th position of the dibenzofuran core directly or via the linker, the organic compound of the present disclosure has high energy level of triplet state. Namely, due to the bonding position at the dibenzofuran core, the energy level of triplet state of the organic compound is increased, and the emitting efficiency and the lifespan of the organic compound and the organic light emitting diode are improved.

Organic Light Emitting Diode

In the vacuum chamber of about $10^{-7}$ Torr, layers are sequentially deposited on an ITO substrate.

(a) HIL (50 Å, HATCN), (b) HTL (500 Å, NPB), (c) EBL (100 Å, MCP), (d) EML (300 Å, HOST: Dopant (30 wt %, Formula 8)), (e) ETL (300 Å, TPBI), (f) EIL (10 Å, LiF), and (g) Cathode (1000 Å, Al)

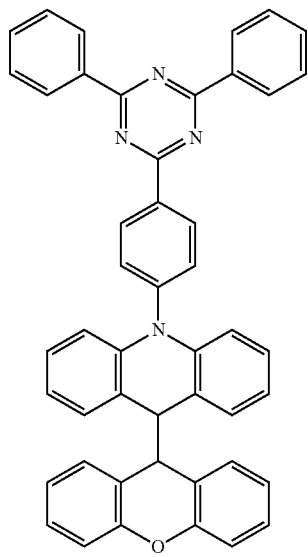

Formula 8

Comparative Example 1 (Ref1)

The compound of Formula 5 is used as the host.

Comparative Example 2 (Ref2)

The compound of Formula 6 is used as the host.

Comparative Example 3 (Ref3)

The compound of Formula 7 is used as the host.

Example 1 (Ex1)

The compound 1 of Formula 4 is used as the host.

Example 2 (Ex2)

The compound 2 of Formula 4 is used as the host.

Example 3 (Ex3)

The compound 3 of Formula 4 is used as the host.

Example 4 (Ex4)

The compound 4 of Formula 4 is used as the host.

The properties of the organic light emitting diodes of Ref1 to Ref3 and Ex1 to Ex4 are measured. The driving voltage, the external quantum efficiency (EQE), and the CIE color coordinate of the organic light emitting diodes are measured using the power supply (KEITHLEY) and the photometer (PR650) and listed in Table 2.

TABLE 2

|  | voltage [V] | EQE [%] | CIE (y) |
|---|---|---|---|
| Ref1 | 5.4 | 8.0 | 0.35 |
| Ref2 | 4.9 | 9.3 | 0.31 |
| Ref3 | 4.1 | 8.7 | 0.36 |
| Ex1 | 3.6 | 10.5 | 0.35 |
| Ex2 | 4.0 | 11.9 | 0.32 |
| Ex3 | 4.1 | 12.0 | 0.33 |
| Ex4 | 3.6 | 12.4 | 0.36 |

As shown in Table 2, in comparison to the organic light emitting diodes of Ref1 to Ref3, the emitting efficiency, e.g., the EQE, of the organic light emitting didoes of Ex1 to Ex4 using the organic compounds of the present disclosure as the host is remarkably increased.

As mentioned above, the organic compound, such as CBP, is used as the host in the EML. The CBP compound is a p-type host and generally has relatively high energy level of triplet state.

In the EML including a dopant and a host, an energy level of triplet state of the host is required to be higher than that of the dopant to increase an energy efficiency. Accordingly, the p-type host, which has relatively high energy level of triplet state, is used in the EML.

However, when the p-type host is used, there are problems in the emitting efficiency and/or the lifespan. The problems may be caused by shift of the emitting zone, i.e., a recombination zone.

Figure 7A:
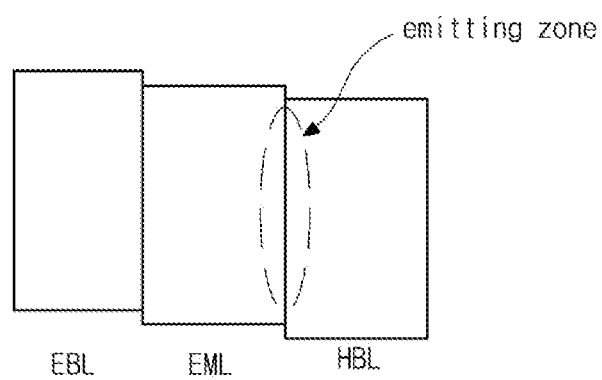
FIGS. 7A and 7B are schematic views illustrating emission in an organic light emitting diode using a p-type host and an organic light emitting diode of the present disclosure, respectively.

Namely, referring to FIG. 7A, which is a view illustrating emission in an organic light emitting diode using a p-type host, the mobility of the hole becomes relatively fast due to the p-type host in the EML such that the emitting zone (recombination zone of hole and electron) is generated to be near an interface between the EML and the HBL.

Figure 7B:
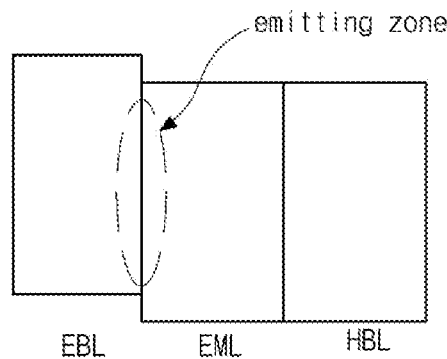

On the other hand, referring to FIG. 7B, which is a view illustrating emission in an organic light emitting diode of the present disclosure, the mobility of the electron becomes relatively fast due to the n-type host, i.e., the organic compound of the present disclosure, in the EML such that the emitting zone (recombination zone of hole and electron) is generated to be near an interface between the EML and the EBL.

A position of the emitting zone is shifted by the property difference between the p-type host and the n-type host such that the emitting efficiency and the lifespan of the organic light emitting diode is also changed as shown in Table 2.

In all cases of the light emitting diodes using the p-type host and the n-type host, the emitting zone is generated to be shifted one side of the EML. However, when the emitting zone is generated to be closer to the first electrode, for example, in a region near an interface between one of the EBL and the HTL and the EML, the emitting efficiency and the lifespan of the organic light emitting diode are improved.

On the other hand, although the organic light emitting diodes of Ref2 and Ref3 use the n-type host, i.e., the compounds in Formulas 6 and 7, the energy level of triplet state of each of the compounds in Formulas 6 and 7 is lower than that of the organic compound of the present disclosure such that the emitting efficiency and the lifespan of the organic light emitting diode in Ref2 and Ref3 are decreased. Namely, as described above, since the carbazolyl moiety and the dibenzofuranyl moiety are bonded to 2th position or 8th position of the dibenzofuran core, respectively, in the compounds in Formula 6 and Formula 7, each of the compounds in Formula 6 and Formula 7 has the energy level of triplet state being lower than the organic compound of the present disclosure.

Since the substituent, e.g., dibenzofuranyl moiety or carbazolyl moiety, is bonded to 4th position and/or 6th position of the dibenzofuran core directly or via the linker in the organic compound of the present disclosure, the organic compound of the present disclosure has the n-type property and high energy level of triplet state. Accordingly, the emitting efficiency and the lifespan of the organic light emitting diode and the OLED device using the organic compound are improved.

Figure 8:
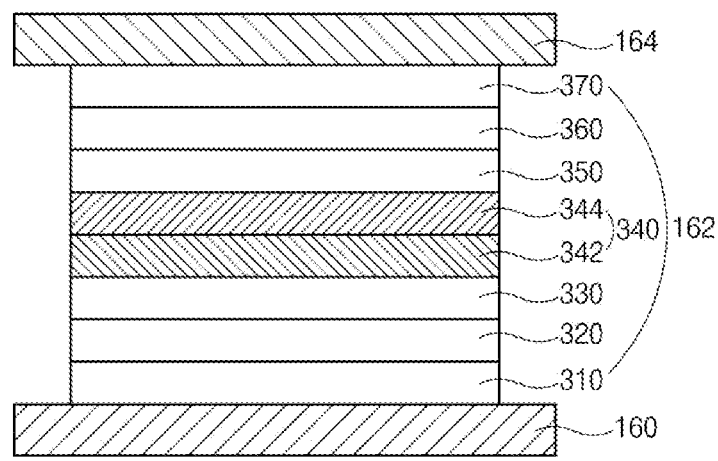
FIG. 8 is a schematic cross-sectional view of an organic light emitting diode of the present disclosure.

FIG. 8 is a schematic cross-sectional view of an organic light emitting diode of the present disclosure.

As shown in FIG. 8, an organic light emitting diode D includes the first and second electrodes 160 and 164, which face each other, and the organic emitting layer 162 therebetween. The organic emitting layer 162 includes an EML 340, which includes first and second layers 342 and 344 and is positioned between the first and second electrodes 160 and 164, a HTL 320 between the first electrode 160 and the EML 340 and an ETL 360 between the second electrode 164 and the EML 340.

In addition, the organic emitting layer 162 may further include a HIL 310 between the first electrode 160 and the HTL 320 and an EIL 370 between the second electrode 164 and the ETL 360.

Moreover, the organic emitting layer 162 may further include an EBL 330 between the HTL 320 and the EML 340 and a HBL 350 between the EML 340 and the ETL 360.

For example, in the EML 340, the first layer 342 (e.g., a first emitting material layer) may include the organic compound of the present disclosure as a first host and a delayed fluorescent dopant as a first dopant, and the second layer 344 (e.g., a second emitting material layer) may include a second host and a fluorescent dopant as a second dopant. Alternatively, the second layer 344 may include the organic compound of the present disclosure as a first host and a delayed fluorescent dopant as a first dopant, and the first layer 342 may include a second host and a fluorescent dopant as a second host. The second host may be the organic compound of the present disclosure. The delayed fluorescent dopant has an energy level of singlet state being larger than the fluorescent dopant.

The organic light emitting diode, where the first layer 342 includes the delayed fluorescent dopant and the second layer 344 includes the fluorescent dopant, will be explained.

In the organic light emitting diode D, the energy level of singlet state and the energy level of triplet state of the delayed fluorescent dopant are transferred into the fluorescent dopant such that the emission is generated from the fluorescent dopant. Accordingly, the quantum efficiency of the organic light emitting diode D is increased, and the FWHM of the organic light emitting diode D is narrowed.

The delayed fluorescent dopant as the first dopant has high quantum efficiency. However, since the light emitted from the delayed fluorescent dopant has wide FWHM, the light from the delayed fluorescent dopant has bad color purity. On the other hand, the fluorescent dopant as the second dopant has narrow FWHM and high color purity. However, since the energy level of triplet state of the fluorescent dopant is not engaged in the emission, the fluorescent dopant has low quantum efficiency.

Since the EML 340 of the organic light emitting diode D in the present disclosure includes the first layer 342, which includes the delayed fluorescent dopant, and the second layer 344, which includes the fluorescent dopant, the organic light emitting diode D has advantages in both the emitting efficiency and the color purity.

The energy level of triplet state of the delayed fluorescent dopant is converted into the energy level of singlet state of the delayed fluorescent dopant by the RISC effect, and the energy level of singlet state of the delayed fluorescent dopant is transferred into the energy level of singlet state of the fluorescent dopant. Namely, the difference between the energy level of triplet state of the delayed fluorescent dopant and the energy level of singlet state of the delayed fluorescent dopant is less than 0.3 eV such that the energy level of triplet state of the delayed fluorescent dopant is converted into the energy level of singlet state of the delayed fluorescent dopant by the RISC effect.

As a result, the delayed fluorescent dopant has an energy transfer function, and the first layer 342 including the delayed fluorescent dopant is not engaged in the emission. The emission is generated in the second layer 344 including the fluorescent dopant.

The energy level of triplet state of the delayed fluorescent dopant is converted into the energy level of singlet state of the delayed fluorescent dopant by the RISC effect. In addition, since the energy level of singlet state of the delayed fluorescent dopant is higher than that of the fluorescent dopant, the energy level of singlet state of the delayed fluorescent dopant is transferred into the energy level of singlet state of the fluorescent dopant. As a result, the fluorescent dopant emits the light using the energy level of singlet state and the energy level of triplet state such that the quantum efficiency (emitting efficiency) of the organic light emitting diode D is improved.

In other words, the organic light emitting diode D and the OLED device 100 (of FIG. 1) including the organic light emitting diode D has advantages in both the emitting efficiency and the color purity:

In each of the first and second layers 342 and 344, the first and second hosts may have a percentage by weight being larger than the delayed fluorescent dopant and the fluorescent dopant, respectively. In addition, the percentage by weight of the delayed fluorescent dopant in the first layer 342 may be greater than that of the fluorescent dopant in the second layer 344. As a result, the energy transfer from the delayed fluorescent dopant into the fluorescent dopant is sufficiently generated.

The energy level of singlet state of the first host is greater than that of the delayed fluorescent dopant, and the energy level of triplet state of the first host is greater than that of the delayed fluorescent dopant. In addition, the energy level of singlet state of the second host is greater than that of the fluorescent dopant.

When not satisfying this condition, a quenching happens at the first and second dopants or an energy transfer from the host to the dopant does not happen, and thus the quantum efficiency of the organic light emitting diode D is reduced.

As mentioned above, since the organic compound of the present disclosure has high energy level of triplet state, the energy transfer efficiency into the delayed fluorescent compound is increased such that the emitting efficiency of the organic light emitting diode D is improved. In addition, since the organic compound of the present disclosure having the n-type property is included in the EML as the host, the recombination of hole and electron in the EML 340 is generated to be shifted toward the first electrode 160 such that the emitting efficiency and the lifespan of the organic light emitting diode D is further improved.

For example, the second host, which is included in the second layer 344 with the fluorescent dopant, may be same as a material of the HBL 350. In this instance, the second layer 344 may have a hole blocking function with an emission function. Namely, the second layer 344 may serve as a buffer layer for blocking the hole. When the HBL 350 is omitted, the second layer 344 serves as an emitting layer and a hole blocking layer.

When the first layer 342 includes the fluorescent dopant and the second layer 344 includes the delayed fluorescent dopant, the first host of the first layer 342 may be same as a material of the EBL 330. In this instance, the first layer 342 may have an electron blocking function with an emission function. Namely, the first layer 342 may serve as a buffer layer for blocking the electron. When the EBL 330 is omitted, the first layer 342 serves as an emitting layer and an electron blocking layer.

Figure 9:
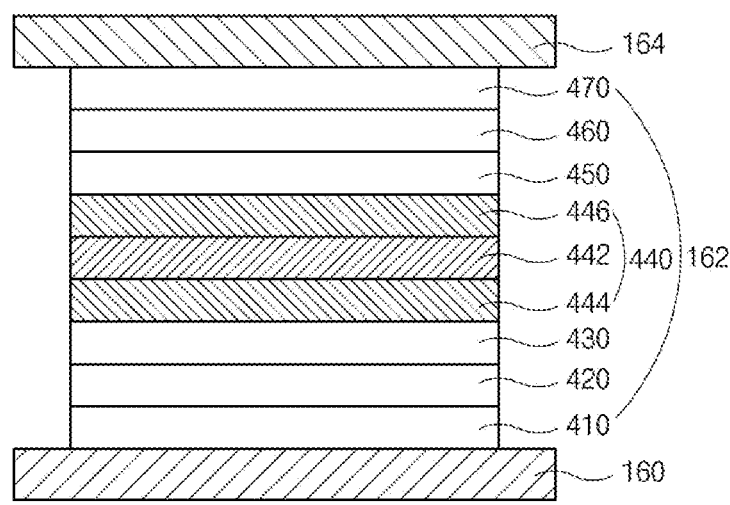
FIG. 9 is a schematic cross-sectional view of an organic light emitting diode of the present disclosure.

FIG. 9 is a schematic cross-sectional view of an organic light emitting diode of the present disclosure.

As shown in FIG. 9, an organic light emitting diode D includes the first and second electrodes 160 and 164, which face each other, and the organic emitting layer 162 therebetween. The organic emitting layer 162 includes an EML 440, which includes first to third layers 442, 444 and 446 and is positioned between the first and second electrodes 160 and 164, a HTL 420 between the first electrode 160 and the EML 440 and an ETL 460 between the second electrode 164 and the EML 440.

In addition, the organic emitting layer 162 may further include a HILL 410 between the first electrode 160 and the HTL 420 and an EIL 470 between the second electrode 164 and the ETL 460.

Moreover, the organic emitting layer 162 may further include an EBL 430 between the HTL 420 and the EML 440 and a HBL 450 between the EML 440 and the ETL 460.

In the EML 440, the first layer 442 is positioned between the second layer 444 and the third layer 446. Namely, the second layer 444 is positioned between the EBL 430 and the first layer 442, and the third layer 446 is positioned between the first layer 442 and the HBL 450.

The first layer 442 (e.g., a first emitting material layer) may include the organic compound of the present disclosure as a first host and a delayed fluorescent dopant as a first dopant, and the second layer 344 (e.g., a second emitting material layer) may include a second host and a fluorescent dopant as a second dopant. The third layer 446 (e.g., a third emitting material layer) may include a third host and a fluorescent dopant as a third dopant. The fluorescent dopant in the second and third layers 444 and 446 may be same or different. The second and third hosts may be the organic compound of the present disclosure. The delayed fluorescent dopant has an energy level of singlet state being larger than the fluorescent dopant.

In the organic light emitting diode D, the energy level of singlet state and the energy level of triplet state of the delayed fluorescent dopant are transferred into the fluorescent dopant in the second layer 444 and/or the third layer 446 such that the emission is generated from the fluorescent dopant. As a result, the quantum efficiency of the light emitting diode D is increased, and the FWHM of the light from the light emitting diode D is narrowed.

In each of the first to third layers 442, 444 and 446, the first to third hosts may have a percentage by weight being larger than the first to third dopants, respectively. In addition, the percentage by weight of the delayed fluorescent dopant (i.e., the first dopant) in the first layer 442 may be greater than that of each of the fluorescent dopant (i.e., the second dopant) in the second layer 444 and the fluorescent dopant (i.e., the third dopant) in the third layer 446.

The energy level of singlet state of the first host is greater than that of the delayed fluorescent dopant, and the energy level of triplet state of the first host is greater than that of the delayed fluorescent dopant. In addition, the energy level of singlet state of the second host is greater than that of the fluorescent dopant in the second layer 444, and the energy level of singlet state of the third host is greater than that of the fluorescent dopant in the third layer 446.

As mentioned above, since the organic compound of the present disclosure has high energy level of triplet state, the energy transfer efficiency into the delayed fluorescent compound is increased such that the emitting efficiency of the organic light emitting diode D is improved. In addition, since the organic compound of the present disclosure having the n-type property is included in the first layer 442 as the host, the recombination of hole and electron in the EML 440 is generated to be shifted toward the first electrode 160 such that the emitting efficiency and the lifespan of the organic light emitting diode D is improved. Moreover, when the organic compound of the present disclosure having the n-type property is included in the second layer 444 as the host, the recombination of hole and electron in the EML 440 is generated to be shifted toward the first electrode 160 such that the emitting efficiency and the lifespan of the organic light emitting diode D is further improved.

For example, the second host in the second layer 444 may be same as a material of the EBL 430. In this instance, the second layer 444 may have an electron blocking function with an emission function. Namely, the second layer 444 may serve as a buffer layer for blocking the electron. When the EBL 430 is omitted, the second layer 444 serves as an emitting layer and an electron blocking layer.

The third host in the third layer 446 may be same as a material of the HBL 450. In this instance, the third layer 446 may have a hole blocking function with an emission function. Namely, the third layer 446 may serve as a buffer layer for blocking the hole. When the HBL 450 is omitted, the third layer 446 serves as an emitting layer and a hole blocking layer.

The second host in the second layer 444 may be same as a material of the EBL 430, and the third host in the third layer 446 may be same as a material of the HBL 450. In this instance, the second layer 444 may have an electron blocking function with an emission function, and the third layer 446 may have a hole blocking function with an emission function. Namely, the second layer 444 may serve as a buffer layer for blocking the electron, and the third layer 446 may serve as a buffer layer for blocking the hole. When the EBL 430 and the HBL 450 are omitted, the second layer 444 serves as an emitting layer and an electron blocking layer and the third layer 446 serves as an emitting layer and a hole blocking layer.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode, comprising:
a first electrode;
a second electrode facing the first electrode; and
a first emitting material layer between the first and second electrodes;
a hole transporting layer between the first electrode and the first emitting material layer;
a hole injection layer between the first electrode and the hole transporting layer;
an electron blocking layer between the hole transporting layer and the first emitting material layer;
an electron transporting layer between the first emitting material layer and the second electrode;
an electron injection layer between the electron transporting layer and the second electrode; and
a hole blocking layer between the first emitting material layer and the electron transporting layer,
wherein the first emitting material layer comprises a first host and a first dopant, and the first host includes an organic compound of Formula 1:

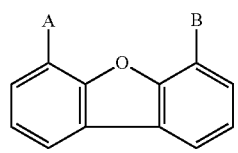

wherein A is selected from the group consisting of:

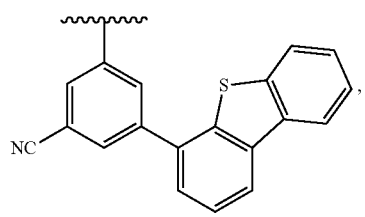

Formula 1 and B is selected from the group consisting of:

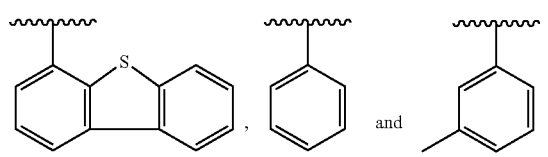

2. The organic light emitting diode according to claim 1, wherein the organic compound is Compound 25:

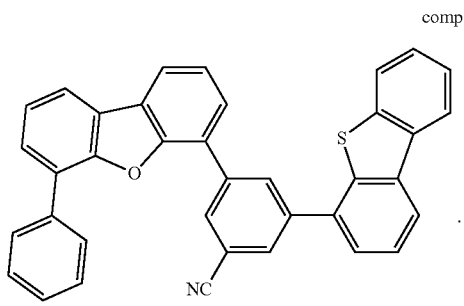

compound 25

3. The organic light emitting diode according to claim 1, wherein the first dopant has the following structure:

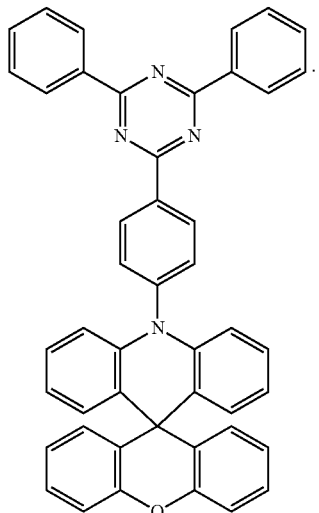 [SMILES: c1ccc(-c2nc(-c3ccccc3)nc(-c3ccc(N4c5ccccc5C5(c6ccccc6Oc6ccccc65)c5ccccc54)cc3)n2)cc1]

* * * * *